United States Patent [19]

Chan

[11] Patent Number: 4,775,640
[45] Date of Patent: Oct. 4, 1988

[54] ELECTRONIC DEVICE TEST METHOD AND APPARATUS

[75] Inventor: Eric Y. Chan, Trenton, N.J.

[73] Assignee: American Telephone and Telegraph Company, New York, N.Y.

[21] Appl. No.: 44,626

[22] Filed: May 1, 1987

[51] Int. Cl.$^4$ ............................................. G01R 31/26
[52] U.S. Cl. ...................................... 437/8; 437/172; 324/158 D; 350/96.11
[58] Field of Search ............... 324/158 D; 437/8, 170, 437/172; 148/DIG. 162; 350/96.11

[56] References Cited

U.S. PATENT DOCUMENTS

| | | | |
|---|---|---|---|
| 3,839,781 | 10/1974 | Russell | 437/8 |
| 4,318,587 | 3/1982 | Grassl | 350/96.20 |
| 4,489,477 | 12/1984 | Chik et al. | 437/8 |
| 4,498,730 | 2/1985 | Tanaka et al. | 350/96.16 |
| 4,516,837 | 5/1985 | Soref et al. | 350/96.15 |
| 4,521,069 | 6/1985 | Ikeda | 350/96.13 |

FOREIGN PATENT DOCUMENTS

| | | | |
|---|---|---|---|
| 0000145 | 1/1983 | Japan | 437/8 |
| 0052839 | 3/1983 | Japan | 437/8 |

*Primary Examiner*—Olik Chaudhuri
*Attorney, Agent, or Firm*—Roderick B. Anderson

[57] ABSTRACT

Apparatus for automatically testing LEDs formed in a wafer (11) includes a computer (15), a test probe (21) for applying a bias to an individual LED and a sensor probe (32) for positioning the test probe with respect to a contact (57) on the LED. Light from the LED is transmitted by an optical fiber (22) to opto-electronic equipment (18) for analysis and characterization by the computer (15). LED bias is provided by a pulse generator (35) and faulty diodes are marked by a marker probe (31). Each LED contains a lens portion (60) for directing LED light to the optical fiber (22).

15 Claims, 3 Drawing Sheets

ELECTRONIC DEVICE TEST METHOD AND APPARATUS

TECHNICAL FIELD

This invention relates to methods and apparatus for testing electronic devices, and, more particularly, to methods and apparatus for testing light emitting diodes while such diodes are still part of a semiconductor wafer.

BACKGROUND OF THE INVENTION

Modern electronic devices are commonly made by using mask and etch techniques to form simultaneously a number of such devices on the surface of a semiconductor wafer. An important part of any fabrication method is to test devices to ascertain that they conform to predetermined specifications. Devices formed on silicon wafers are commonly tested while they are still part of the wafer ("wafer level") by using electrical probes to direct current through individual devices and also to detect the response of the device to such current. Light emitting diodes are normally made on wafers of III-V material and are not as easily tested as are silicon devices. (III-V materials are compounds formed predominantly from elements of the periods III and V of the periodic table).

Light emitting diodes (LEDs) typically comprise a junction diode having a metalized contact on the upper surface of the wafer and a metal contact on the lower surface. Because III-V materials are much more fragile than silicon, test procedures which require contacting a typical spring-biased test probe to the metal contact pad frequently results in damage to the device, particularly if the testing procedure is automated. Damage could be reduced by using care in slowly bringing the contact pad into contact with the metal probe, but this would increase the time and cost of fabrication. Also, when testing LEDs at the wafer level biasing one LED with current from the test probe typically causes adjacent LEDs to emit light. Since device tests require analysis of light from the device under test, significant amounts of interfering light, or crosstalk, cannot be tolerated. Another problem is that, while individual LEDs have heat sinks to dissipate device heat during operation, such heat sinks are incorporated only after the wafer is separated into individual LED devices. Thus, at the wafer level, there is little heat sinking, which gives rise to a danger of heat damage to individual devices during the biasing required for testing.

For these reasons, final testing of LED is typically made only after the LEDs have been separated from the wafer and encapsulated as individual devices. If a successful technique could be devised for testing LEDs at the wafer level, then one could avoid the expense of encapsulating and heat sinking LEDs that are inoperative or which malfunction. This could be especially advantageous in the case of a defective wafer, in which very few of the component LEDs would in fact meet specification. Further, testing at the wafer level would make it easier analyze the cause of any malfunction and to detect it at an earlier stage of device fabrication.

SUMMARY OF THE INVENTION

In accordance with the invention, the foregoing problems of testing electronic devices at the wafer level are solved in an automated wafer-level testing arrangement for LEDs in which a sensor probe, closely adjacent to the test probe, is used to define precisely the location of the test probe with respect to the contact pad of the LED with which it makes contact. With the test probe so located, the contact pad can quickly be brought into contact with it with minimal physical impact. The sensor probe contacts an inactive region of the wafer so that local damage by the sensor probe would be very unlikely to affect the performance of any LED in the wafer.

Surfaces of individual LEDs are shaped in the form of a lens and an optical fiber having a somewhat larger diameter than that of the lens is brought into close proximity with the lens. Thus, when a diode is biased to emit light, the light from that LED can be directed to a specific optical fiber and the optical fiber transmits light only from the LED to which it is coupled. The emission of light from adjacent LEDs therfore has no effect on light transmitted by the optic fiber.

A circuit to be described below analyzes light from the LED together with current through the LED to determine whether the LED meets specifications. If it does not, a marker probe is used to transmit ink to stain a surface region in or adjacent to the LED to give a visual indication of its malfunction. The LED is biased by current in the form of pulses to avoid over-heating of the LED during operation.

These and other features of the invention will be better appreciated consideration of the following detailed description taken in conjunction with the accompanying drawing.

DETAILED DESCRIPTION

Figure 1:
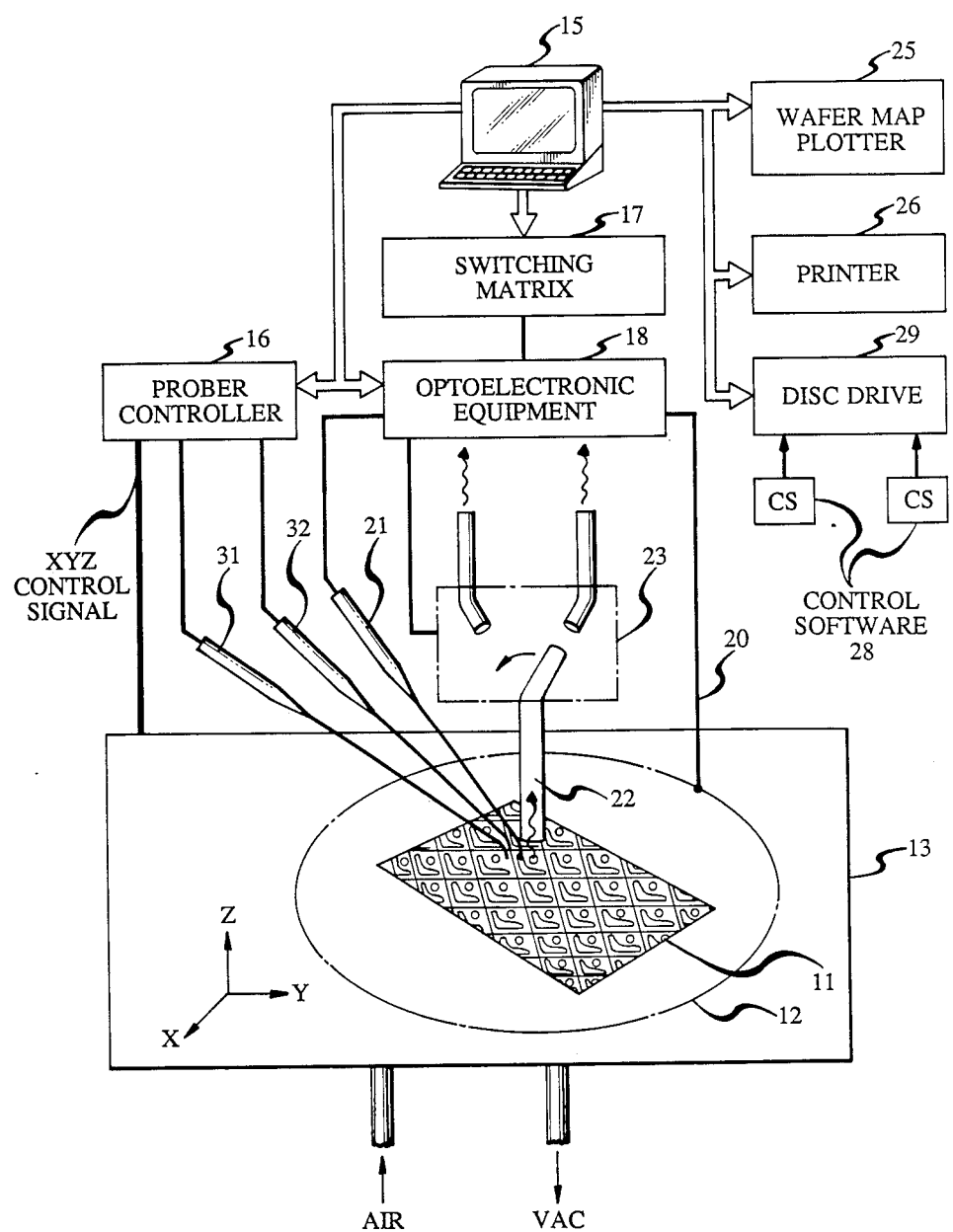
FIG. 1 is a schematic representation of testing apparatus in accordance with one embodiment of the invention.

Referring now to FIG. 1, there is shown a schematic diagram of a completely automated system for testing and characterizing individual LEDs at the wafer level in accordance with an illustrative embodiment of the invention. The wafer 11 containing individual LEDs to be tested is supported on a gold plated alumina plate 12 which in turn is mounted by a vacuum chuck on a prober 13. The prober 13 is capable of moving the wafer in X, Y and Z directions, as indicated in the drawing, with great precision. A prober which has been successfully used for this purpose is commercially available from the Electroglass Company of Santa Clara, Calif. and known as the 2001X Prober.

The system is controlled by a computer 15, which controls prober controller 16, switching matrix 17, and opto-electronic equipment 18. Contact to all of the LEDs of the wafer is made by a lead 20 to the gold plated plate 12. Individual diodes of the wafer are tested by applying a current to lead 20, through a selected LED by way of a test probe 21, which biases the LED to cause it to emit light. The emitted light is collected by an optical fiber 22 and transmitted to an optical switch 23. The switch transmits the light to the opto-electronic equipment 18 which analyzes it to determine peak emission wavelength and spectral width. The bias current voltage and power are also measured and this information is transmitted via switching matrix 17 to the computer 15. The computer compares the transmitted information with predetermined specifications for current vs. voltage (I-V), optical power vs. current (L-I), peak emission wavelength ($\lambda_p$) and spectral width ($\Delta\lambda$). As successive LEDs are tested in this manner, a wafer map plotter 25 may be used to generate a map showing correspondence of individual LEDs on the wafer with specifications, while a printer 26 prints out more detailed characterizations. The computer 15 is operated by control software 28 by way of disc drive 29.

After each LED has been tested, the computer 15 and prober controller 16 cause the prober 13 to move the wafer 11 in appropriate X, Y and Z directions so as to bring successive LEDs into contact with test probe 21. Prober controller 16 also controls a marker probe 31 so as to release a small quantity of ink near any LED that has failed specifications, thereby to stain the wafer at that location to give a visual indication. Prober controller 16 also controls a sensor probe 32 which generates a signal to control the Z direction movement of the wafer, as will be described more fully below, to avoid any damage of the LED by the test probe 21.

Figure 2:
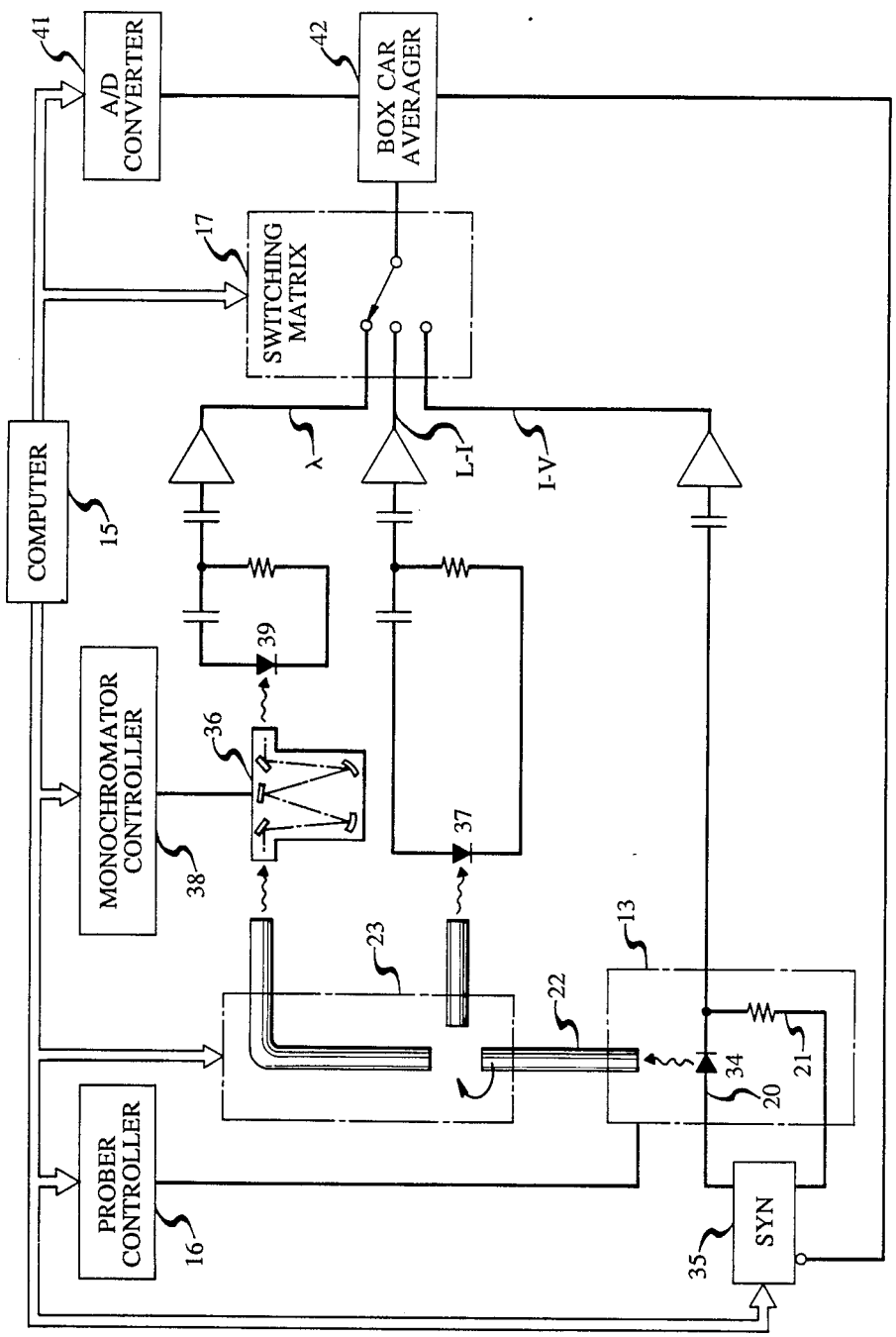
FIG. 2 is a schematic representation of part of the apparatus of FIG. 1.

Certain of the elements of FIG. 1 are shown in somewhat more detail in the schematic diagram of FIG. 2. The individual wafer diode under test is shown schematically at 34. A programmable pulse generator 35 applies bias pulses to the LED with a pulse width of typically 40 microseconds and a repetition rate of 10 milliseconds. It has been found that with the III-V material LEDs, to be described more fully with reference to FIG. 4, this form of biasing will give a usable light output without heating the LED as to cause physical damage. Conventional DC biasing has been found to be unsuitable because the LEDs at this stage of the fabrication do not have adequate heat sinking to dissipate the heat resulting from a steady-state bias.

Light is directed from the optical switch 23 alternately to a monochromator 36 and a germanium detector 37. The germanium detector 37 generates a signal proportional to light intensity for optical power versus current measurements while the monochromator detects intensity as a function of wavelength. As is known, a controller 38 causes the monochromator 36 to scan the wavelength of the light so that intensity can be characterized as a function of wavelength. The monochromator output is detected by a germanium detector 39 and directed to the switching matrix 17. The double lines leading from the computer designate a computer bus which leads both to the switching matrix 17 and to an analog-to-digital converter 41 which is connected to a boxcar averager 42. The computer coordinates the switching of the switching matrix 17, the controller 38, the optical switch 23, and the pulse generator 35 so that input current and voltage functions to the LED can be coordinated with light output functions from the LED.

FIGS. 1 and 2 demonstrate how the various functions of coordinating, characterizing and testing can be combined in a single system to operate automatically. For example, separate tests do not have to be made to obtain current versus voltage (I-V) and spectral width ($\Delta\lambda$) measurements as is normally the case.

Figure 3:
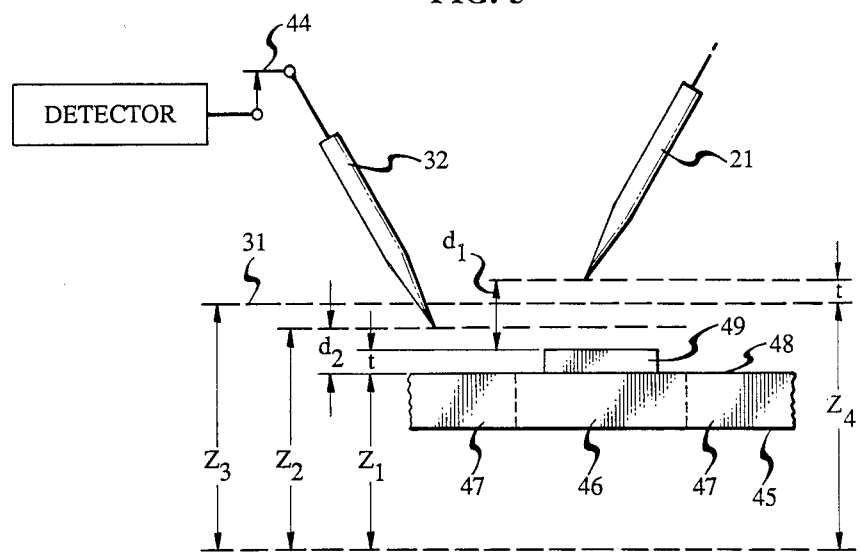
FIG. 3 is a schematic view illustrating a method of testing an electronic device in accordance with general principles of the invention.

The function of the sensor probe 32 of FIG. 1 in preventing damage to the LED by the test probe 21 will be explained in more detail with reference to FIG. 3, which illustrates schematically the general principles involved. Consider a wafer 45 in which it is desired to define a multiplicity of electronic devices within active regions 46 interconnected by inactive regions 47. After device fabrication the devices will be separated from the wafer by cutting along the inactive regions and only those portions of the wafer contained within the active regions will have any significance to the device operation.

While the upper surface 48 of the wafer is generally that, there may be slight undulations of the surface and the wafer itself may not always be precisely planar. Thus, the vertical height $Z_1$ of the surface 48 may vary from one device to another. Upon the surface of the active region a metal contact region 49 is formed which has a predetermined thickness t that does not substantially vary because all of the metal contacts on a single wafer are made in a single step. However, thickness t may vary slightly from one wafer to another.

The sensor probe 32 is located a distance $d_2$ over the surface of an inactive region of the wafer while the test probe 21 is located at a distance $d_1$ from the upper surface of the active contact region 49. $d_1$ is larger than $d_2$ by a distance of $d_3$, or, $$d_3 = d_1 - d_2 \qquad (1)$$

Once $d_3$ is determined (as will be described below) the test probe is contacted to each active contact region 49 by vertically raising the wafer 45 until the inactive region contacts sensor probe 32 and then raising the wafer an additional distance $d_3$ so that the active contact region 49 contacts the test probe 21. That is, when the wafer is first oriented for device test, the wafer surface is at a height $Z_1$. When it is raised to a height $Z_2$ it contacts sensor probe 32 which opens a switch 44 to give an indication of the contact. If the impact of the sensor probe on the wafer slightly damages the wafer, such damage is of no consequence because it would be limited to the inactive region. Thereafter, the wafer is raised a precise distance $d_3$ to reach the height $Z_4$ at which the active contact touches test probe 21. This contact can be made by automatic apparatus quite quickly, since the danger of impact damage resulting from "overshoot" is avoided, and yet a dependable contact can be assured for activating the device. Even though the planarity of wafer surface 48 may vary somewhat from one device to another, damage caused by impact of probes on the wafer will be limited to the inactive region.

For the production of III-V material LEDs, it is preferred that the distance $d_3$ be calibrated for each wafer. In principle this could be done by, first, raising the surface of the wafer to height $Z_2$ at which contact with the sensor probe is first observed, and recording the value of $Z_2$. Thereafter, the wafer could be raised very slowly until a light output were observed from an LED. At this point the wafer surface would have reached height $Z_4$ and the distance $d_3$ could be computed and recorded for use with other LEDs of the wafer.

In practice, the following technique, in conjunction with the commercially available prober 13, of FIG. 1, has been found to be more practical. The prober controller is programmed so that after contact with the sensor probe 32 at height $Z_2$ the motor drives the wafer vertically an additional distance, $z_1$. Thus, the wafer surface stops at height $Z_3$. Thereafter, the prober is programmed to drive the wafer vertically at steps each equaling 0.25 mil, which is convenient because the prober is driven by a stepper motor. The distance $z_1$ is chosen with respect to the approximate distance $d_3$ to be greater than one step of the stepper motor and to minimize the time taken to drive the wafer by one-quarter mil steps to contact the test probe 21. When wafer height $Z_4$ is reached and the LED emits light, vertical movement is of course stopped and the value of $d_3$ is computed by the formula $$d_3 = z_i + (Z_4 - Z_3). \qquad (2)$$

After calibration, subsequent LEDs can, of course, be contacted by the test probe 21 quite quickly without any danger of impact because the wafer is raised vertically to precisely the correct height above the sensor probe. The entire process is automated, with the sensor probe at each location generating a signal that the computer uses to control the prober drive to make contact with the test probe.

Figure 4:
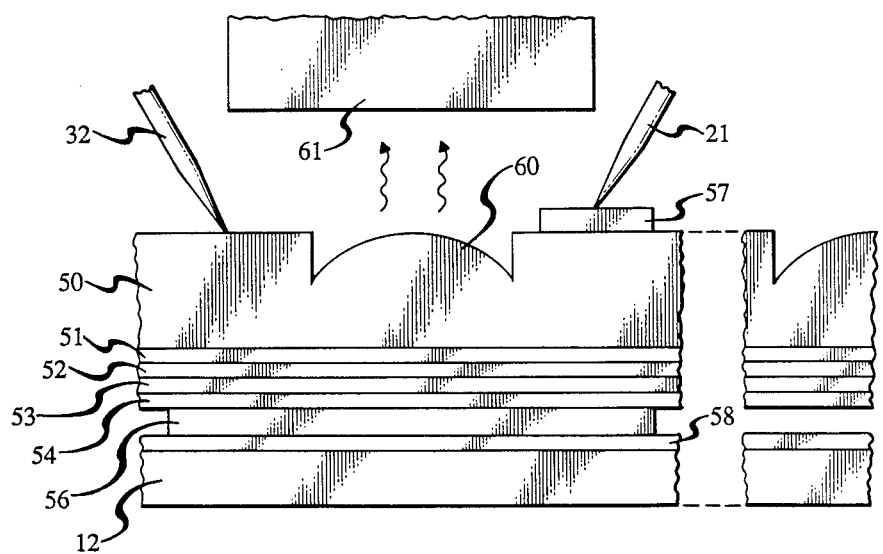
FIG. 4 is a schematic view showing a method for testing an LED in accordance with an embodiment of the invention.

FIG. 4 shows application of the invention to the III-V material wafer-level LEDs for which it was designed. Each LED comprises an indium phosphide substrate portion 50 having a thickness of typically 100 microns and four epitaxial layers 51, 52, 53 and 54. Layer 51 is indium phosphide, layer 52 is indium gallium arsenide phosphide, layer 53 is indium phosphide and layer 54 is a layer of indium gallium arsenide phosphide. Layers 51–54 are made by epitaxial growth techniques and are physically quite thin. The LED is of course a diode having opposite contacts 56 and 57. Contact with 57 is made by way of test probe 21 and contact with 56 is made by way of gold plating 58 on alumina plate 12. The metal contact 57 has a thickness of about 3 microns. The substrate portion 50 is etched to form a lens 60 for directing light from the LED. The portion of the wafer removed from the lens 60 and the contact 57 constitutes an inactive region of the wafer, and it is only an inactive region against which the sensor probe 32 abuts. The drawing is not intended to be to scale and the separation between adjacent devices, which may be about 200 microns, is sufficient to give ample space for making contact of sensor probe 21 with an inactive surface region.

Separated about 20 microns from the lens 60 is the end of the optical fiber 61 (corresponding to fiber 22 of FIG. 1), which has a somewhat larger diameter than that of the lens 60. When the LED is biased, light is generated in the region of the epitaxial layers and is directed by lens 60 into the end of the optical fiber 61. The applied bias current normally also causes light emission from typically ten or so adjacent LEDs, but through the cooperation of the optical fiber wih the lens 60 of a single LED, there is substantially no interference or crosstalk by light of adjacent diodes. After testing, the devices are separated by cutting (which may be sawing or etching) the wafer and are then individually encapsulated.

One can appreciate from the foregoing that a single system has been described which automatically tests all of the LEDs of a wafer before wafer separation and without manual intervention. It is to be understood that the specific dimensions, distances, material compositions, and system components and parameters were given only for purposes of illustrating one embodiment of the invention. Various modifications, including without limitation other dimensions, distances, material compositions, and system components and parameters, may be made by those skilled in the art without departing from the spirit and scope of the invention.

What is claimed is:

1. A method for making electronic devices comprising the steps of forming the electronic devices in active regions of a semiconductor wafer, the remaining surface area of the wafer constituting inactive regions, each electronic device having an active contact region with a surface at a predetermined height with respect to the surface of an adjacent inactive region, contacting the active contact region with a conductive test probe, applying a current via the test probe through the electronic device, observing a response to the electronic device to the current, and thereafter cutting the wafer along inactive regions to separate the individual electronic devices, characterized by the steps of:

locating the test probe a first distance $d_1$ above a first active contact region;

locating a sensor probe a second distance $d_2$ above a first inactive region adjacent the first active region, the second distance $d_2$ being smaller than the first distance $d_1$;

vertically moving, relative to the probes, the wafer to contact the first inactive region to the sensor probe and recording a function of the height $Z_2$ of the wafer upon initial contact of the inactive region with the sensor probe;

moving the wafer further with respect to the probes to make contact of the first active region with the test probe and recording a function of the hight $Z_4$ of the wafer upon initial contact with the test probe;

computing a distance $d_3$ equal to the difference of the first and second distances, $d_1 - d_2$; and making repeated tests on other electronic devices of the wafer by, first, moving the wafer relative to the probes such that the test probe overlies an active contact region of an electronic device and the sensor probe overlies an adjacent inactive region, second, raising the wafer relative to the probes until the sensor probe is contacted, and, third, thereafter raising the wafer relative to the probes by a distance $d_3$, whereby the test probe makes contact with the active contact region.

2. The method of claim 1 further characterized in that:

after contact of the first inactive region with the sensor probe, the wafer is raised an additional predetermined distance $z_1$ to a height $Z_3$ which is recorded; and the distance $d_3$ is computed by the relationship, $$d_3 = z_1 + (Z_4 - Z_3).$$

3. The method of claim 2 further characterized in that:

the relative movement of the wafer is made by a stepper motor which moves the wafer in equal steps each of less than one mil; and the distance $z_1$ is more than the distance through which the wafer is moved by one step of the stepper motor.

4. The method of claim 3 further characterized in that:

the electronic devices are LEDs;

the response of each LED to the applied current is detected by transmitting light from the LED on an optic fiber;

the step of forming the LED includes the step of forming an upper surface in the shape of a lens; and the optic fiber is positioned with respect to the LED such that the lens of the LED directs light into one end of the optic fiber.

5. The method of claim 4 further characterized in that:

the current applied via the test probe is applied in the form of pulses of sufficiently short duration to preclude bias current heating damage of the LED or the wafer.

6. The method of claim 5 further characterized by the steps of:

locating a marker probe in close proximity to the sensor probe;

analyzing the light transmitted from the LED by the optic fiber; and if the analysis of the light does not conform to specifications, transmitting ink by way of the marker probe to the wafer, thereby creating a visible stain at or near the LED.

7. Apparatus for testing electronic devices in a wafer having inactive regions surrounding active regions in which the devices are formed, each electronic device having an active contact region with a surface at a predetermined height with respect to the surface of an adjacent inactive region;

means comprising a conductive test probe for contacting the active contact region;

means for applying a current via the test probe to the electronic device;

means for recording a response of the electronic device to the current;

characterized by means for locating the test probe at a first distance $d_1$ above the first active contact region;

means for locating a sensor probe at a second distance $d_2$ above a first inactive region adjacent the first active region, the second distance $d_2$ being smaller than the first distance $d_1$;

means for vertically moving, relative to the probe, the wafer to contact the first inactive region to the sensor probe;

means comprising a computer for recording a function of the height $Z_2$ of the wafer upon initial contact of the inactive region with the sensor probe;

means for moving the wafer further with respect to the probes to make contact of the first active region with the test probe;

means comprising the computer for recording a function of the height $Z_4$ of the wafer upon initial contact with the test probe;

means comprising the computer for computing a distance $d_3$ equal to the difference of the first and second distances, $d_1 - d_2$; and means for making repeated tests on other electronic devices of the wafer by, first, moving the wafer relative to the probes such that the test probe overlies an active contact region of an electronic device and the sensor probe overlies an adjacent inactive region, second, raising the wafer relative to the probes until the sensor probe is contacted, and, third, thereafter raising the wafer relative to the probes by a distance $d_3$, whereby the test probe makes contact with the active contact region.

8. The method of claim 7 further characterized in that the means for moving the wafer comprises a stepper motor which moves the wafer in equal steps each of less than 1 mil.

9. The method of claim 8 further characterized in that the electronic devices LEDs;

the means for detecting a response comprises an optic fiber;

each LED includes an upper surface in a shape of a lens; and the optic fiber is positioned with respect to the LED such that the lens of the LED directs light into one end of the optic fiber.

10. The apparatus of claim 9 further characterized in that the means for applying current to the test probe comprises means for applying current in form of pulses of sufficiently short duration to preclude bias current heating damage of the LED or the wafer.

11. The apparatus of claim 10 further characterized by a marker probe in close proximity to the sensor probe;

means for analyzing light transmitted from the LED by the optic fiber; and means including the computer for transmitting ink by way of the marker probe to the wafer if the analysis of the light does not conform to specifications, thereby creating a visible stain at or near the LED.

12. The apparatus of claim 11 further characterized in that the means for analyzing the light comprises means for switching the output of the optic fiber alternately between a monochromator and a first light detector;

means comprising the monochromator and the computer for generating optical intensity versus optical wavelength characteristics; and means comprising the first light detector and the computer for generating optical power versus LED current characteristics.

13. A method for making LEDs comprising the steps of: forming a plurality of closely-spaced LEDs in a wafer, cutting the wafer to separate the individual LEDs, and testing the individual LEDs by monitoring light transmitted from such LED to a test circuit, characterized in that:

the testing step occurs prior to the coating step;

current is applied to individual successive LEDs under test to cause light emission therefrom, such current application unavoidably causing simultaneous emission of light from a plurality of adjoining LEDs;

an optic fiber is used to transmit light from the LED to the test circuit; and an end of the optic fiber is successively brought into close proximity with successive individual LEDs under test so as to transmit light selectively from the LED under test without interference from other LEDs of the wafer.

14. The method of claim 13 further characterized in that:

the side of each LED from which light is emitted is fabricated in the form of a lens; and the end of the optic fiber for transmitting light from the LED is brought into close alignment with the lens.

15. The method of claim 14 further characterized in that:

light transmitted by the optic fiber is light emitted substantially only from the LED to which it is in close proximity;

and the test circuit comprises optoelectronic circuitry and a computer for analyzing the light.

* * * * *

UNITED STATES PATENT AND TRADEMARK OFFICE
CERTIFICATE OF CORRECTION

PATENT NO. : 4,775,640

DATED : October 4, 1988

INVENTOR(S) : Eric Y. Chan

It is certified that error appears in the above—identified patent and that said Letters Patent is hereby corrected as shown below:

Column 6, Line 32, delete "hight" and substitute therefor --height--.

Signed and Sealed this

Fourth Day of April, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,775,640
DATED : October 4, 1988
INVENTOR(S) : ERIC. Y. CHAN

It is certified that error appears in the above—identified patent and that said Letters Patent is hereby corrected as shown below:

Column 8, Line 3, delete "method" and substitute therefor --apparatus--.
Column 8, Line 7, delete "method" and substitute therefor --apparatus--.

Signed and Sealed this

Twenty-seventh Day of June, 1989

Attest:

DONALD J. QUIGG

Attesting Officer

Commissioner of Patents and Trademarks